Dec. 2, 1969 H. K. SPANNHAKE 3,481,777

ELECTROLESS COATING METHOD FOR MAKING PRINTED CIRCUITS

Filed Feb. 17, 1967

INVENTOR
HENRY K. SPANNHAKE

BY Julius B. Kraft
ATTORNEY 3,481,777
Patented Dec. 2, 1969

3,481,777

ELECTROLESS COATING METHOD FOR MAKING PRINTED CIRCUITS

Henry K. Spannhake, Poughkeepsie, N.Y., assignor to International Business Machines Corporation, Armonk, N.Y., a corporation of New York Filed Feb. 17, 1967, Ser. No. 616,814
Int. Cl. B44d 1/14, 1/34, 1/18
U.S. Cl. 117—212 12 Claims

ABSTRACT OF THE DISCLOSURE

A method of making a printed circuit by electrolessly plating a thin layer of copper on a non-conductive substrate and oxidizing the copper layer to cupric oxide. Then, using a resist over the cupric oxide which exposes a selected pattern, the exposed cupric oxide is decomposed preferably by treatment with an acid. Metal is then deposited electrolessly in the exposed pattern.

BACKGROUND OF THE INVENTION

Figure 1:
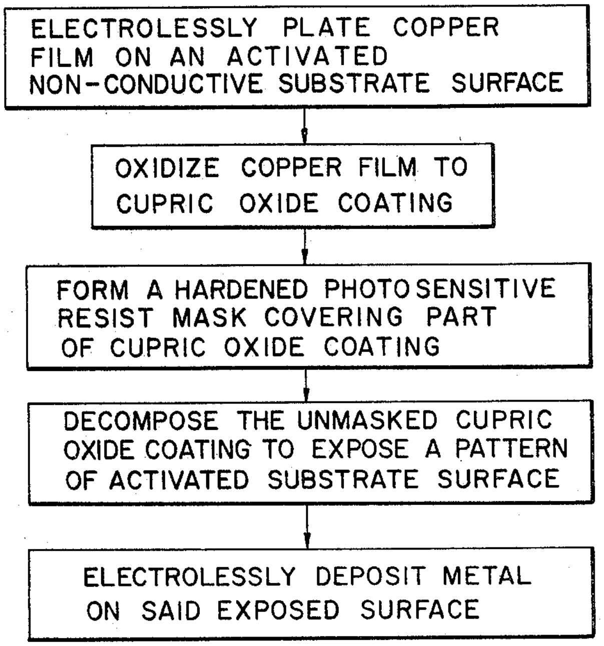

This present invention relates to electroless plating and more specifically to the production of printed circuits by electroless plating. Printed circuits have been conventionally produced by a variety of methods. Copper sheets have been affixed with a suitable adhesive to non-conductive bases, and the copper has then been selectively etched away to leave a conductive pattern in the configuration of the desired circuit. Also, printed circuits have been deposited on non-conductive bases through stencils such as photosensitive resists. In these conventional methods, there is a loss of metal which increases the cost of production. Methods of electrolessly depositing printed circuits have been sought as potential improvements over these existing methods. In addition to minimizing loss of metals, electroless methods are potentially less time consuming and more efficient than the conventional methods in large volume production. However, attempts to produce commercially desirable microelectronic printed circuits electrolessly have met with difficulties because of close tolerances required by the high density of wiring lines per unit area. One method which has been tried involves the deposition of an ink consisting of receptive metallic particles on the substrate in the selected circuit pattern by a stenciling method such as silk screening. Then, the inked substrate is treated with an electroless solution of metal. Securing good adhesion between such printed circuits and the substrates has been a problem in the art.

Electroless plating or depositing of metals on non-conductive substrates requires the presence of catalytic nuclei which are generally noble metals such as palladium, gold or platinum at discrete nucleation centers on the substrate. Such centers are conventionally formed by applying an acidified solution of a noble metal chloride such as palladium dichloride to the nonconductive substrate which has already been sensitized with a material which is readily oxidized. Typically stananous salts such as stannous chloride are used. The stannous chloride is oxidized reducing the palladium dichloride to palladium at the nucleation centers. The substrate containing such centers is referred to as an activated substrate.

A problem which has hampered the development of electroless methods for making printed circuits is the preservation of the nucleation centers when masking the activated substrate with a photosensitive resist. Before the electroless deposition of metal, the activated substrate should be masked with a resist, leaving uncovered the areas which are to be non-conductive. The photosensitive plastic layer on the substrate is exposed to light and hardened in the areas which are to be nonconductive in the circuit. The unexposed and unhardened areas of the photosensitive layer must then be removed from the areas which are to be electrolessly plated. The organic solvents necessary to remove the unhardened photosensitive layer such as toluene or xylene unfortunately destroy the underlying nucleation centers, thereby making subsequent deposition of metal in the electroless method impractical. In the method of the present invention, a cupric oxide layer preserves the nucleation centers during the formation of the resist.

The closest prior art appears to be U.S. Patent No. 3,146,125, Schneble et al. The patent teaches applying, by dusting, a layer of cuprous oxide particles to a non-conductive substrate, masking a portion of the cuprous oxide layer with a resist and reducing the exposed cuprous oxide to copper.

Summary of the invention

In accordance with the present invention, a printed circuit is electrolessly produced by first electrolessly plating a film of copper on an activated surface of a non-conductive substrate. The activated surface contains nucleation centers formed by any of the conventional methods. The copper film is then oxidized to cupric oxide. A resist is then formed on the layer of cupric oxide. The resist masks a portion of the layer, leaving an exposed pattern of cupric oxide in the selected configuration of the circuit. The cupric oxide layer acts to preserve the nucleation centers on the surface of the substrate during the formation of the resist which, as has been previously mentioned, is formed by exposing a light-hardenable photosensitive plastic or polymeric layer to light. The unhardened photosensitive layer must then be removed from the areas forming the circuit pattern. The cupric oxide under the photosensitive layer in these areas is substantially unaffected by the aromatic hydrocarbon solvents such as toluene or xylene used to remove the layer, thereby protecting the underlying nucleation centers from the action of said solvents. The uncovered cupric oxide is then removed by decomposition to expose the preserved nucleation centers on the substrate surface in the circuit pattern. The selected metal which is to form the conductive element in the circuit is then deposited electrolessly on the exposed substrate in the pattern of the circuit.

The Schneble et al. patent does not disclose electrolessly depositing a film of copper which is then converted to cupric oxide in situ. In addition, cupric oxide would not be operable in the method of the patent if it were to be mechanically deposited in place of the cuprous oxide. The method of the patent reduces the cuprous oxide to metallic copper by an acid treatment. Such an acid treatment of cupric oxide would not reduce it to the metallic copper required in the method of Schneble et al.

The drawings

FIGURE 1 is a flow chart of a preferred embodiment of the present invention.

FIGURES 2 through 6 diagrammatically illustrate the change in structure of a printed circuit element during the steps of the method of this invention.

Preferred embodiments

The following is an example of one preferred embodiment of the present invention with reference made to the drawings. A non-conductive substrate such as fiberglass impregnated with an epoxy resin is prepared by roughening its surface in the conventional manner and cleaning with any standard mildly alkaline aqueous cleaning solution. The substrate is then rinsed and treated with a 10% solution of sulphuric acid, rinsed again and then treated with a 50% solution of HCl. The surface of the substrate is then activated in the standard manner by treatment with the sensitizer of 30 g. stannous chloride and 10 ml. concentrated HCl per liter of water for 10 seconds at room temperature, then rinsing in water followed by treatment with an activator of 0.1 g. palladium dichloride and 10 ml. concentrated HCl per liter of water for about 15 to 30 seconds at room temperature. The activated surface is then immersed in an aqueous electroless copper solution of the following compositon for 5 minutes at room temperature:

(A) 5 parts by volume of an aqueous solution of

| | | |
|---|---|---|
| Rochelle Salts ($NaKC_4H_4O_6H_2O$) | g./l. | 170 |
| $CuSO_45H_2O$ | g./l. | 35 |
| NaOH | g./l. | 50 |
| $Na_2CO_3$ | g./l. | 30 |
| Sodium salt of ethylenediamine tetraacetic acid | ml./l. | 5 |

mixed with:

(B) 1 part by volume of a 37% solution of formaldehyde in methanol.

Figure 2:
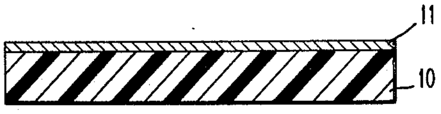

A transparent layer of copper on the surface of the substrate is just visible. The layer has a thickness in the order of $1\times10^{-6}$ inch. The resulting structure is shown in FIGURE 2. Copper film 11 covers the surface of non-conductive substrate 10.

Figure 3:
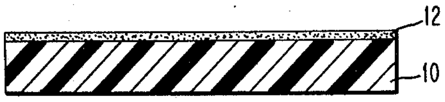

Then the copper film is oxidized to cupric oxide by treatment with an oxidizing agent, "Ebonal-C" (a 1 lb./gallon aqueous solution of equal parts by weight of sodium hydroxide and sodium chlorite) at 200° F. for a period of about 30 to 60 seconds until the copper film turns jet black. FIGURE 3 illustrates the layer of cupric oxide 12 on substrate 10. The structure is then rinsed and heated at 250° F. for about 1 hour.

Figure 4:
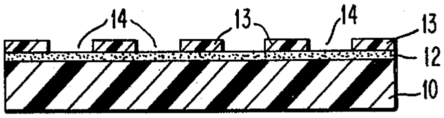

The cupric oxide layer is next coated with a thin uniform coating of a conventional photosensitive resist material. The resist material is a dielectric and a good electrical insulator. Any conventional resist material may be used. Such materials are well known in the art. One suitable resist material is styrene monomer containing phenosafranin dye as a photosensitizer present in an amount in the order of .02% of the material weight. Another resist material which may be used is Kodak Photo Resist. The photosensitive resist material is applied and cured in the standard manner, e.g., 180° F. for about 6 hours. Then the photosensitive resist is exposed to light through a positive transparency so that the areas which are to be nonconductive in the printed circuit are exposed to light and harden. The unhardened portions of the resist coating are then removed by a solvent such as xylene or toluene leaving, as shown in FIGURE 4, the hardened resist 13 in the areas which are to be the non-conductive areas and exposed cupric oxide 12 forming the pattern of the conductive circuit 14.

Figure 5:
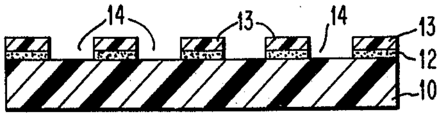
Figure 6:
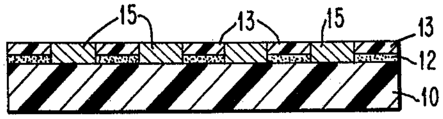

The exposed cupric oxide in areas 14 is then dissolved in an acid solvent such as a 20% solution of HCl at room temperature to expose the surface of nonconductive substrate 12 in the pattern of the circuit 14 as shown in FIGURE 5. The surface still contains preserved nucleation centers. The substrate surface is then immersed in an electroless copper solution having the previously described composition for about 5 minutes at room temperature until a transparent layer of copper is just visible in areas 14. At this stage it is preferable to remove the structure from the solution and heat to drive off any volatile contaminants which may be trapped in the deposited copper layer or between the copper layer and the substrate. This may be accomplished by heating at 250° F. for about 1 hour. The structure is then again immersed in the electroless copper solution until the copper deposits 15 in the circuit pattern reach the desired thickness as shown in FIGURE 6. Alternatively, after the heating step, the copper deposits 15 may be built up to the desired thickness by other means such as electroplating. It has been found that the heating step to remove volatile contaminants does improve the adhesion of the copper deposits to the substrate. However, for many purposes, the adhesion may be satisfactory without the heating step. In such cases, the heating step need not be carried out, and the structure may be immersed in the copper solution for an uninterrupted period until the deposits 15 reach the desired thickness.

While the above illustrative example describes a process where copper is the metal deposited on the exposed activated surface in the circuit pattern, any metal which is conventionally electrolessly deposited such as nickel, palladium, cobalt, gold, silver, tin and rhodium may be deposited instead of copper by immersing the resist masked substrate with the circuit pattern exposed in an electroless plating solution of the appropriate metal.

The non-conductive substrate may be any of the standard non-conductive substrates used in printed circuits such as glass, ceramics, pyroceram or plastics such as Mylar (polyethylene terephthalate), Teflon (tetrafluoroethylene), acetates, nylon, Lucite (polyalkylacrylates) and epoxy resin/glass laminates.

As previously mentioned, the resist material may be any conventional photosensitive resist. Although the resist may be temporary and removable after the metal has been deposited in the circuit pattern, a resist which is permanent in the nonconductive areas may also be used. The resists described in the example may be made permanent if desired by curing at temperatures sufficient to cross-link the resist compositions. Other resist materials which provide permanent resists are photosensitive polyester resin compositions. One use of permanent resists would be in multi-layered structures as insulators and supports. In this connection, it is to be noted that cupric oxide provides an excellent material for bonding the permanent resist to the substrate.

In the illustrative example, for best results, the copper film which is initially plated over the substrate is sufficiently thin to be visually transparent. It appears a film of such thickness insures that all of the copper in the film will be oxidized to copper oxide. However, such a thin film is not required and the method may be satisfactorily carried out using thicker initial copper films.

The preferred method of decomposing and removing the exposed cupric oxide is with an acid which dissolves the cupric oxide without substantially affecting the underlying nucleation centers. Suitable acids include 2 to 50% solutions of HCl, 2 to 50% solutions of sulphuric acid, 2 to 50% solutions of nitric acid as well as acids such as citric and acetic acid.

It should be noted that unless otherwise indicated, all proportions in the specification and claims are by weight.

What is claimed is:

1. A method for forming printed circuits comprising:

(a) electrolessly plating a film of copper on an activated surface of a non-conductive substrate;

(b) oxidizing said copper to cupric oxide;

(c) masking a portion of said oxide with a resist leaving an exposed pattern of cupric oxide;

(d) decomposing and removing the exposed pattern of cupric oxide; and (e) electrolessly depositing metal on said exposed pattern.

2. The method of claim 1 wherein said plated film of copper is just visible.

3. The method of claim 1 wherein the metal is copper which is electrolessly deposited on said exposed pattern in a film of a thickness so as to be just visible.

4. The method of claim 3 wherein the substrate bearing the pattern of electrolessly deposited metal is heated to remove volatile contaminants in said deposited metal and between said deposited metal and said substrate.

5. The method of claim 4 wherein additional metal is deposited on the pattern of electrolessly deposited metal after the heating.

6. The method of claim 1 wherein the metal electrolessly deposited on said exposed pattern is copper.

7. The method of claim 1 wherein said decomposition is carried out by dissolving the exposed oxide with an acid.

8. The method of claim 7 wherein said acid is hydrochloric acid.

9. The method of claim 1 wherein said resist is non-conductive.

10. The method of claim 9 wherein said resist is bonded to said cupric oxide.

11. The method of claim 9 wherein said resist is a film-forming polymeric material.

12. A method of electroless plating comprising:

(a) applying an electroless plating activator to a surface of a non-conductive substrate;

(b) depositing a film of copper on said activated surface;

(c) oxidizing said copper to cupric oxide;

(d) masking a portion of said oxide with a resist, leaving an exposed pattern of cupric oxide;

(e) decomposing and removing the exposed pattern of cupric oxide; and, (f) electrolessly depositing metal on said exposed pattern.

References Cited

UNITED STATES PATENTS

| | | | |
|---|---|---|---|
| 3,340,161 | 9/1967 | Zimmerman et al. | 29—625 |
| 3,269,861 | 8/1966 | Schneble et al. | 117—212 |
| 3,240,602 | 3/1966 | Johnston | 96—36.2 |
| 3,169,892 | 2/1965 | Lemelson | 174—68.5 |
| 3,146,125 | 8/1964 | Schneble et al. | |

OTHER REFERENCES

J. H. Marshall, "Producing Metallic Deposits," IBM Technical Disclosure Bulletin, vol. 5, No. 7, December 1962.

ALFRED L. LEAVITT, Primary Examiner

ALAN GRIMALDI, Assistant Examiner

U.S. Cl. X.R.

29—625; 96—36.2; 117—47; 174—68,5